(12) United States Patent
Hayashi et al.

(10) Patent No.: US 7,151,280 B2
(45) Date of Patent: Dec. 19, 2006

(54) SEMICONDUCTOR DEVICE

(75) Inventors: Tetsuya Hayashi, Yokosuka (JP);
Masakatsu Hoshi, Yokohama (JP);
Saichirou Kaneko, Mukou (JP);
Hideaki Tanaka, Yokosuka (JP)

(73) Assignee: Nissan Motor Co., Ltd.,
Kanagawa-Ken (JP)

( * ) Notice: Subject to any disclaimer, the term of this patent is extended or adjusted under 35 U.S.C. 154(b) by 214 days.

(21) Appl. No.: 11/012,205

(22) Filed: Dec. 16, 2004

(65) Prior Publication Data

US 2005/0133794 A1    Jun. 23, 2005

(30) Foreign Application Priority Data

Dec. 18, 2003   (JP) ............... P2003-420383

(51) Int. Cl.
*H01L 31/0312* (2006.01)
*H01L 31/072* (2006.01)
*H01L 31/109* (2006.01)
*H01L 31/0328* (2006.01)
*H01L 31/0336* (2006.01)

(52) U.S. Cl. ............. 257/77; 257/183; 257/187; 257/192

(58) Field of Classification Search ........... 257/77, 257/183–192
See application file for complete search history.

(56) References Cited

U.S. PATENT DOCUMENTS 5,900,648 A * 5/1999 Harris et al. .............. 257/77

2004/0079989 A1 * 4/2004 Kaneko et al. ............ 257/77
2005/0045892 A1 * 3/2005 Hayashi et al. ........... 257/77
2005/0062048 A1 * 3/2005 Hayashi et al. ........... 257/77

FOREIGN PATENT DOCUMENTS

JP      2002-299625 A    10/2002

* cited by examiner

*Primary Examiner*—Cuong Nguyen
(74) *Attorney, Agent, or Firm*—McDermott Will & Emery LLP

(57) ABSTRACT

A semiconductor device includes a heterojunction semiconductor region 9, which forms a heterojunction with a drain region 2. The heterojunction semiconductor region 9 is connected to a source electrode 7, and has a band gap different from a band gap of a semiconductor substrate constituting the drain region 2. It is possible to set the size of an energy barrier against conduction electrons, which is formed between the drain region 2 and the heterojunction semiconductor region 9, into a desired size by changing the conductivity type or the impurity density of the heterojunction semiconductor region 9. This is a characteristic not found in a Schottky junction, in which the size of the energy barrier is inherently determined by a work function of a metal material. It is easy to achieve optimal design of a passive element in response to a withstand voltage system of a MOSFET as a switching element. It is also possible to suppress diffusion potential in a reverse conduction mode and to improve a degree of integration per unit area. As a result, it is possible to reduce the size of elements and to simplify manufacturing processes thereof.

24 Claims, 11 Drawing Sheets

FORWARD CUT-OFF STATE

REVERSE CONDUCTION STATE

SEMICONDUCTOR DEVICE

BACKGROUND OF THE INVENTION

The present invention relates to a semiconductor device used as a switching element. As disclosed in Japanese Unexamined Patent Publication No. 2002-299625, a switching element incorporating a Schottky diode in a part of a MOSFET formed on a silicon carbide substrate is known. This switching element is configured to function as a bi-directional conductive element having small switching losses. Specifically, the MOSFET functions as the switching element in the forward conduction mode, while the Schottky diode functions as a majority-carrier passive element in the reverse conduction mode or in so-called the freewheeling action.

SUMMARY OF THE INVENTION

However, to operate the Schottky diode as the majority-carrier passive element in the reverse conduction mode, it is necessary to secure a given area for the Schottky diode so as to permit freewheeling of a given current at a potential difference at least equal to or below diffusion potential (3 V) of a pn-junction between a base region and a drain region of the MOSFET. This is because a potential difference between a source electrode and a drain electrode of the MOSFET is equivalent to the diffusion potential of the pn-junction between the base region and the drain region thereof.

Moreover, it is necessary to form the Schottky diode by use of a specific Schottky material to obtain sufficient withstand voltage, which is equivalent to the case of forming only the MOSFET as the switching element. Accordingly, formation of the Schottky diode has been associated with more complexity of manufacturing processes in comparison with the case of forming only the MOSFET.

As described above, the switching element incorporating the Schottky diode according to the related art has the problems in a reduction of an area of the device, which is directly linked with the manufacturing costs, and in a reduction of the manufacturing processes.

An object of the present invention is to provide a semiconductor device including a heterojunction semiconductor region. Here, the heterojunction semiconductor region constitutes a heterojunction with a drain region. Moreover, the heterojunction semiconductor region is connected to a source electrode. In addition, the heterojunction semiconductor region has a band gap which is different from a band gap of a semiconductor substrate constituting the drain region.

Other and further features, advantages, and benefits of the present invention will become more apparent from the following description taken in conjunction with the following drawings.

DETAILED DESCRIPTION OF THE EMBODIMENTS

First Embodiment

[Configuration]

Figure 1:
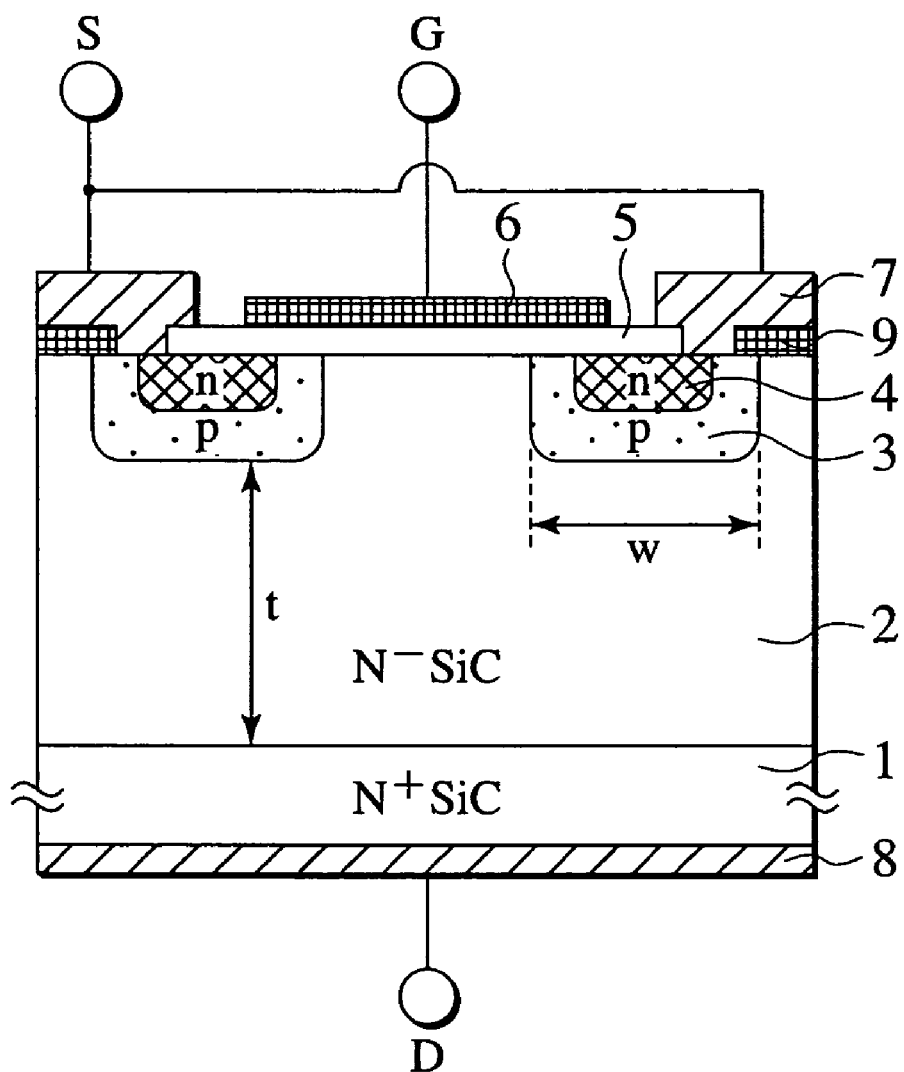
FIG. 1 is a cross-sectional view showing a semiconductor device according to a first embodiment of the present invention.

FIG. 1 is a cross-sectional view showing a semiconductor device according to a first embodiment of the present invention. As shown in FIG. 1, a semiconductor device according to the first embodiment is formed on a semiconductor substrate in which an N⁻-type drain region 2 is formed on a substrate region 1 made of N⁺-type silicon carbide of the 4H polytype, for example. A P-type base region 3 is disposed on an upper part of the drain region 2 including a principal surface of the drain region 2, which is opposite to a joint surface between the drain region 2 and the substrate region 1. An N⁺-type source region 4 is disposed above the base region 3 including the principal surface of the drain region 2. A gate electrode 6 made of N-type polycrystalline silicon, for example, is disposed above the drain region 2, the base region 3, and the source region 4 through an insulating film 5. Further, the base region 3 and the source region 4 are connected to a source electrode 7, and the drain region 2 is connected to a drain electrode 8. In this way, the semiconductor device according to the first embodiment constitutes a metal oxide semiconductor field effect transistor (MOSFET) which functions as a three-terminal switching element including the source, drain, and gate.

FIG. 1 shows a unit cell constituting the MOSFET. The unit cell includes two MOSFETs disposed to face each other while sandwiching the gate electrode 6. The actual semiconductor has a structure of arranging the unit cells shown in FIG. 1 adjacently to one another on the semiconductor substrate.

A heterojunction semiconductor region 9 made of N-type polycrystalline silicon, for example, is disposed between the adjacent unit cells. To be more precise, the heterojunction semiconductor region 9 is disposed on the drain region 2 between the base regions 3 which respectively belong to the adjacent unit cells. The junction between the drain region 2 and the heterojunction semiconductor region 9 constitutes a heterojunction attributable to two materials having different band gaps, namely, silicon carbide and polycrystalline silicon. Accordingly, there is an energy barrier on an interface of the heterojunction. The heterojunction semiconductor region 9 is connected to the source electrode 7. The heterojunction semiconductor region 9 is made of the same material as the gate electrode 6. Therefore, the heterojunction semiconductor region 9 can be formed simultaneously with formation of the polycrystalline silicon layer constituting the gate electrode 6. In this way, the manufacturing process is simplified.

A distance between the heterojunction semiconductor region 9 and the remotest position of the base region 3 from the heterojunction semiconductor region in the direction parallel to a principal surface of the semiconductor substrate, i.e. the distance in the horizontal direction of FIG. 1 (such a distance will be hereinafter referred to as a horizontal distance w), is at least equal to or less than a thickness t of the drain region 2 immediately below the base region 3.

[Forward Direction Operation and Reverse Direction Operation]

The semiconductor device shown in FIG. 1 is supposed to be used as a power conversion element such as an inverter. The semiconductor device functions as a switching element in a forward direction operation and as a passive element in a reverse direction operation, respectively. To be more precise, in a case of the forward direction operation where a current flows from the drain electrode 8 to the source electrode 7, the semiconductor device shown in FIG. 1 functions as the switching element. On the other hand, in a case of the reverse direction operation where the current flows from the source electrode 7 to the drain electrode 8, the semiconductor device shown in FIG. 1 functions as the passive element.

First, the forward direction operation where the semiconductor device functions as the switching element will be described. For example, the semiconductor device holds a cut-off state when the gate electrode 6 is set to the ground potential while grounding the source electrode 7 and applying a positive potential to the drain electrode 8. This is because an energy barrier against conduction electrons attributable to the pn-junction is formed between the source region 4 and the drain region 2 of the MOSFET by the base region 3. This is also because another energy barrier against the conduction electrons attributable to the heterojunction is formed between the heterojunction semiconductor region 9 and the drain region 2. The energy barrier in the heterojunction will be described later with reference to FIG. 2 to FIG. 6.

To convert this cut-off state to a conductive state, given positive potential is applied to the gate electrode 6. In this way, an electric field at the gate electrode 6 spreads out in the base region 3 through the insulating film 5, and an inversion layer of the conduction electrons is formed on an interface with the insulating film 5. Accordingly, the conduction electrons previously shielded by the energy barrier start flowing from the source electrode 7 to the drain region 2 through the source region 4 and the base region 3 formed with the inversion layer, whereby the semiconductor device is set to a conductive state. To shift the conductive state to the cut-off state, the gate electrode 6 is set to the ground potential again. In this way, the inversion layer previously formed in the base region 3 is reset and the energy barrier against the conduction electrons is formed again in the base region 3, whereby the semiconductor device is set to the cut-off state. As described above, the MOSFET functions as the switching element normally even if the heterojunction semiconductor region 9 is incorporated in the MOSFET.

Next, the reverse direction operation (a freewheeling operation) where the semiconductor device functions as the passive element will be described. For example, a reverse conduction current flows between the source electrode 7 and the drain electrode 8 through the heterojunction semiconductor region 9 when the gate electrode 6 and the source electrode 7 are set to ground potential while applying given negative potential to the drain electrode 8.

[Energy Band Structures of Heterojunction]

Characteristics of the heterojunction between the polycrystalline silicon and the silicon carbide will be described in detail with reference to FIG. 2 to FIG. 6. FIG. 2 to FIG. 6 shows energy band structures of the semiconductor. In each of these drawings, the left side shows an energy band structure of the N$^+$-type silicon corresponding to the heterojunction semiconductor region 9, and the right side shows an energy band structure of the N$^-$-type silicon carbide of the 4H polytype corresponding to the drain region 2.

The heterojunction semiconductor region 9 in FIG. 1 is made of polycrystalline silicon. However, in FIG. 2 to FIG. 6, description will be made by use of the energy band structure of silicon instead of polycrystalline silicon. To facilitate understandings of the characteristics of the heterojunction, description will be made on an energy level of an ideal semiconductor heterojunction where no interface level exists on a heterojunction interface.

Figure 2:
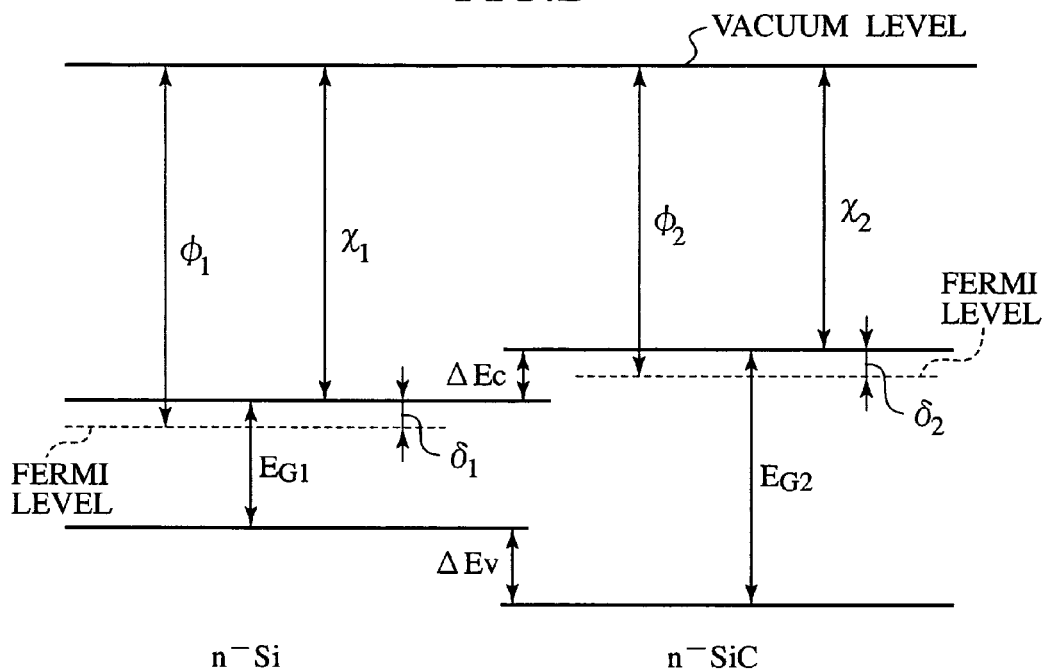
FIG. 2 is an energy band structure diagram (before contact) for explaining the principle of operation of the semiconductor device shown in FIG. 1.

FIG. 2 is a view showing the energy band structures when the silicon and the silicon carbide do not contact each other. In FIG. 2, an electron affinity of the silicon is defined as $\chi_1$, a work function thereof (energy from a vacuum level to a Fermi level) is defined as $\phi_1$, a Fermi energy thereof (energy from a conduction band to the Fermi level) is defined as $\delta_1$, and a band gap thereof is defined as $E_{G1}$. Similarly, an electron affinity of the silicon carbide is defined as $\chi_2$, a work function thereof is defined as $\phi_2$, a Fermi energy thereof is defined as $\delta_2$, and a band gap thereof is defined as $E_{G2}$. As shown in FIG. 2, an energy barrier $\Delta E_C$ exists on the interface between the silicon and the silicon carbide attributable to a difference in the electron affinities χ between both of the substances, and this relation can be expressed by the following formula (1):

$$\Delta E_C = \chi_1 - \chi_2 \quad (1)$$

Figure 3:
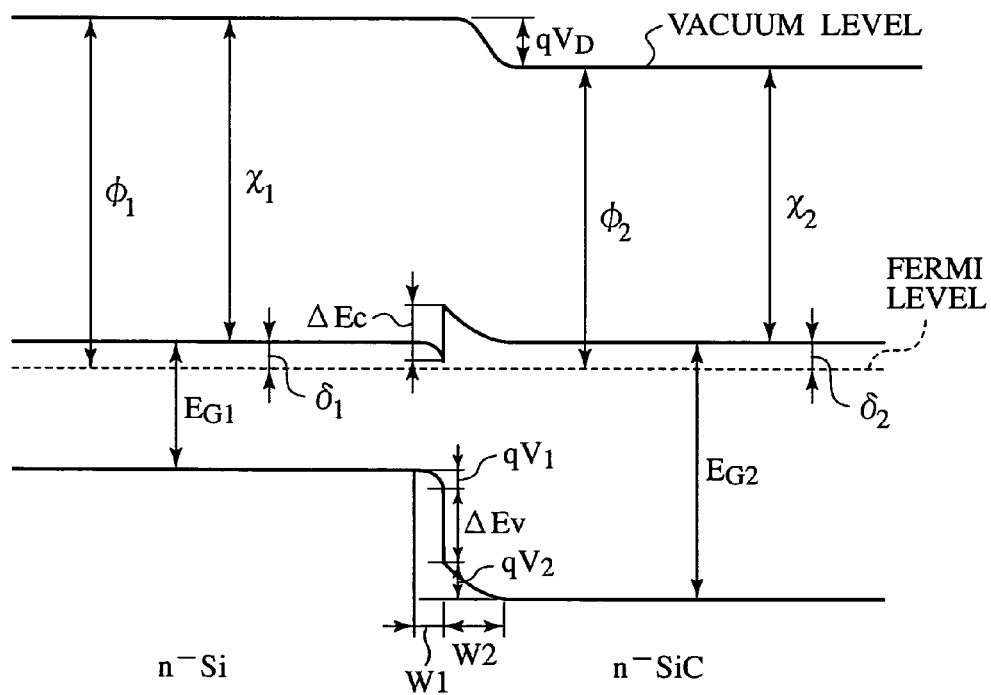
FIG. 3 is an energy band structure diagram (after contact) for explaining the principle of operation of the semiconductor device shown in FIG. 1.

FIG. 3 is a view showing the energy band structures in which the heterojunction between the silicon and the silicon carbide is formed by allowing the silicon and the silicon carbide to contact each other. After allowing both of the silicon and the silicon carbide to contact each other, the energy barrier $\Delta E_C$ remains to exist as similar to the state before the contact. Therefore, an electron accumulation layer having a width W1 is formed on the junction interface on the silicon side. On the contrary, a depletion layer having a width W2 is formed in the junction interface on the silicon carbide side.

Here, diffusion potential generated on the heterojunction interface is defined as $V_D$, a diffusion potential component on the silicon side is defined as $V_1$, and a diffusion potential component on the silicon carbide side is defined as $V_2$. Since the diffusion potential $V_D$ is equivalent to an energy difference between the Fermi levels of the silicon and the silicon carbide, this relation can be expressed by the following formulae (2) to (4):

$$V_D = (\delta_1 + \Delta E_C - \delta_2)/q \quad (2)$$

$$V_D = V_1 + V_2 \quad (3)$$

$$W2 = \sqrt{[(2 \times \epsilon 0 \times \epsilon 2 \times V_2)/(q \times N2)]} \quad (4)$$

Here, $\epsilon 0$ denotes a dielectric constant in vacuum, $\epsilon 2$ denotes a relative dielectric constant of the silicon carbide, and N2 denotes an ionized impurity density of the silicon carbide. The formulae (2) to (4) are based on the Anderson's electron affinity as a band discontinuity model. Accordingly, the formulae represent an ideal state and do not consider a distortion effect.

Figure 4:
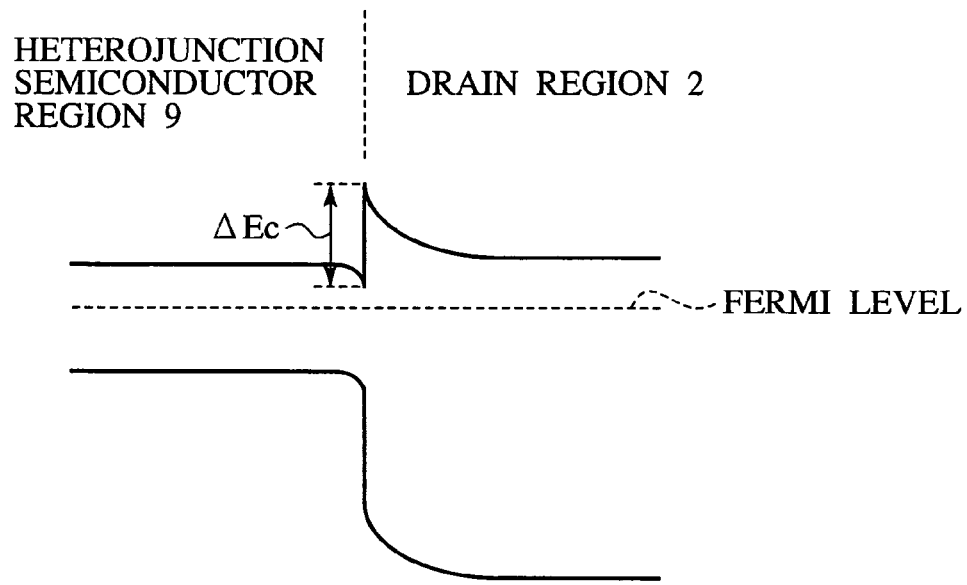
FIG. 4 is an energy band structure diagram (in thermal equilibrium) for explaining the principle of operation of the semiconductor device shown in FIG. 1.
Figure 5:
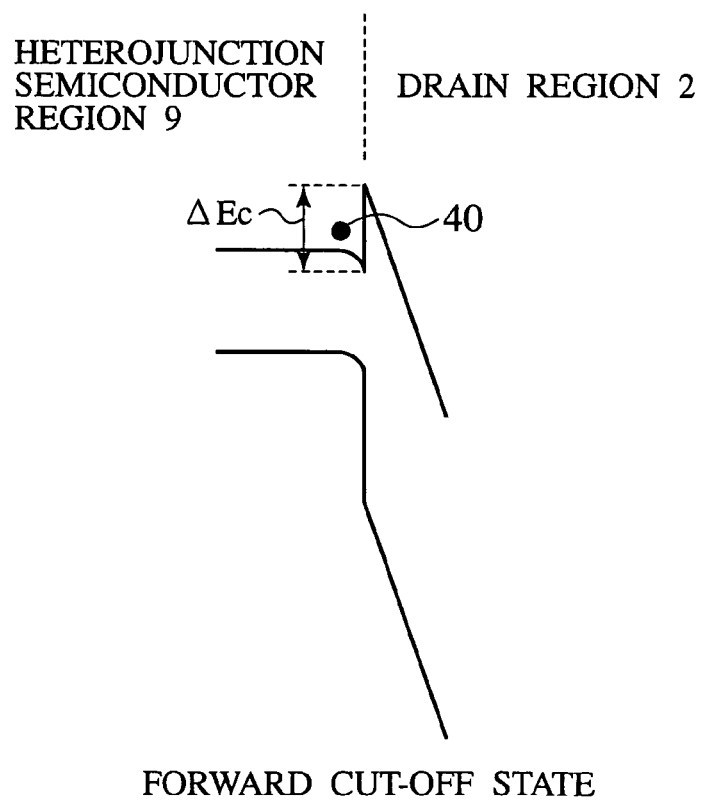
FIG. 5 is an energy band structure diagram (in cut-off state) for explaining the principle of operation of the semiconductor device shown in FIG. 1.
Figure 6:
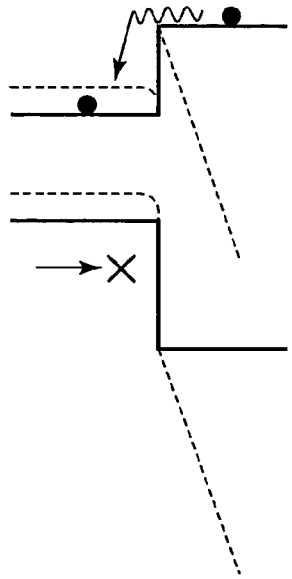
FIG. 6 is an energy band structure diagram (in reverse conduction state) for explaining the principle of operation of the semiconductor device shown in FIG. 1.

FIG. 4 to FIG. 6 shows the energy band structures in the junction interface between the heterojunction semiconductor region 9 and the drain region 2 shown in FIG. 1, which are based on the explanations of FIG. 2 and FIG. 3. FIG. 4 shows a state of thermal equilibrium where no voltage is applied to the source electrode 7 and the drain electrode 8.

As shown in FIG. 5, when the source electrode 7 is set to the ground potential and a given positive potential is applied to the drain electrode 8, a depletion layer spreads out in the drain region 2 in the vicinity of the heterojunction interface in response to the applied drain potential. On the other hand, conduction electrons 40 existing in the heterojunction semiconductor region 9 in the vicinity of the heterojunction interface cannot cross over the energy barrier $\Delta E_C$, and the conduction electrons 40 are accumulated on the heterojunction interface. Therefore, the electric line of force to mach the depletion layer spreading out in the drain region is terminated, and the drain field is shielded by the conduction electrons 40 in the heterojunction semiconductor region 9. For this reason, even in a structure where the thickness of the polycrystalline silicon constituting the heterojunction semiconductor region 9 is very thin, it is possible to maintain the cut-off state, that is, to retain withstand voltage.

As shown in FIG. 6, when the source electrode 7 is set to the ground potential and a given negative potential is applied to the drain electrode 8, the energy band structure in the junction interface between the heterojunction semiconductor region 9 and the drain region 2 transits from the energy band structure in the cut-off state in the forward direction operation indicated by broken lines in FIG. 6 to the direction indicated by solid lines so as to offset the diffusion potential. An electron current flows from the drain region 2 toward the heterojunction semiconductor region 9 because there is virtually no energy barrier against the conduction electrons. On the contrary, a hole current hardly flows from the heterojunction semiconductor region 9 toward the drain region 2 because there is an energy barrier against holes. In other words, the heterojunction conductor region 9 is operated as a majority-carrier passive element. In this way, when the gate electrode 6 and the source electrode 7 are grounded and the given negative potential is applied to the drain electrode 8, a reverse conduction current flows between the source electrode 7 and the drain electrode 8 through the heterojunction semiconductor region 9.

When the heterojunction semiconductor region 9 is used as the passive element, it is possible to set the size of the energy barrier against the heterojunction semiconductor region 9, into a desired size by changing the conductivity type or the impurity density of the heterojunction semiconductor region 9. This is a characteristic not found in a Schottky junction, in which the size of the energy barrier is inherently determined by a work function of a metal material. For this reason, it is easy to achieve optimal design of the passive element in response to a withstand voltage system of the MOSFET as the switching element. Accordingly, it is possible to suppress the diffusion potential in the reverse conduction mode and to improve the degree of integration per unit area.

[Operating Point of Passive Element]

In the reverse conduction mode, a potential difference between the source electrode 7 and the drain electrode 8, i.e. an operating point of the passive element, varies depending on the size of the reverse conduction current relative to the size of the formed passive element. In the case of the related art configured simply to incorporate the Schottky diode into the MOSFET, the operation of the Schottky diode as the majority-carrier passive element in the reverse conduction mode is limited to 3 V or less at the maximum, which is equivalent to the diffusion potential of the pn-junction between the source electrode 7 and the drain electrode 8. This is because the pn-junction between the base region and the drain region is operated when the potential difference between the source electrode 7 and the drain electrode 8 is equal to or above 3 V, and the hole current, which is a minority carrier, also starts flowing. Accordingly, it has been necessary to secure a given area for the Schottky diode so as to permit freewheeling of a given current at the potential difference at least equal to or below the diffusion potential of the pn-junction between the base region and the drain region.

On the contrary, in the first embodiment of the present invention, the horizontal distance w between the heterojunction semiconductor region 9 and the remotest position of the base region 3 from the heterojunction semiconductor region 9 is equal to or below the thickness t of the drain region 2 immediately below the base region 3. In this way, a PN diode is not operated immediately even when a potential difference greater than the diffusion potential of the pn-junction between the base region 3 and the drain region 2 is applied between the drain electrode 8 and the source electrode 7. The reason is as follows.

Figure 7:
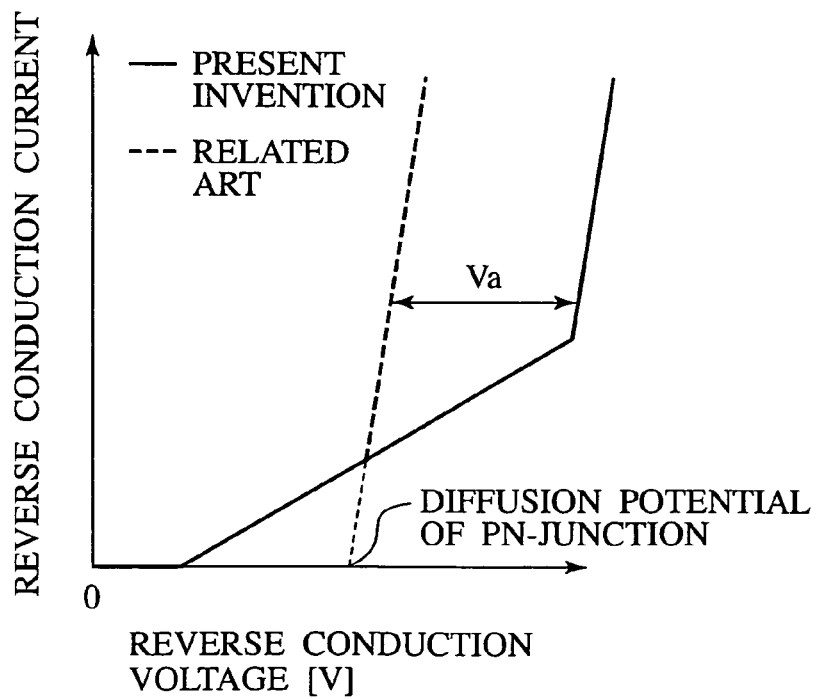
FIG. 7 is a graph showing the voltage-current characteristics (the IV characteristics) in the reverse conduction state of the semiconductor device shown in FIG. 1 and of a semiconductor device according to the related art.

When a given potential difference is applied between the drain electrode 8 and the source electrode 7, the reverse conduction current firstly flows through the heterojunction semiconductor region 9. The reverse conduction current in the drain region 2 flows from a junction with the heterojunction semiconductor region 9 toward a bottom part of the drain region 2 while spreading out in an angle of about 45° C. Accordingly, the reverse conduction current flows across the wide drain region 2 immediately below the base region 3. As a result, drain potential distribution occurs in the drain region 2 in response to the size of resistance and the size of the reverse conduction current. Therefore, part of the potential difference applied between the drain electrode 8 and the source electrode 7 is distributed in the drain region 2. That is to say, the potential difference applied to the pn-junction between the base region 3 and the drain region 2 in the wide peripheral area of the base region becomes smaller than the potential difference applied between the drain electrode 8 and the source electrode 7 by just that much. Therefore, as shown in FIG. 7 as an example, even if the potential greater than the diffusion potential of the pn-junction between the base region 3 and the drain region 2 is applied between the drain electrode 8 and the source electrode 7, the PN diode is not operated immediately unlike a case in the related art. The heterojunction semiconductor region 9 continues to function as the majority-carrier passive element until application of a voltage which is higher by Va than the diffusion potential of the pn-junction.

Figure 8:
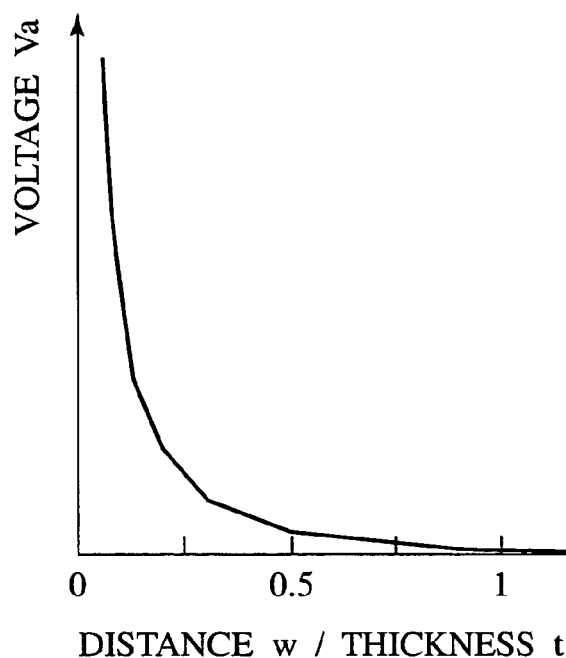
FIG. 8 is a graph showing a relation between an index (distance w/thickness t) and voltage Va overriding diffusion potential.

FIG. 8 is a calculation example showing a relation between a ratio of the horizontal distance w and the thickness t of the drain region 2 shown in FIG. 1, and the size of the voltage Va to top-up the diffusion potential of the pn-junction. As shown in FIG. 8, the voltage Va becomes larger as the ratio (distance w/thickness t) becomes smaller. In the semiconductor device shown in FIG. 1, when the impurity density of the drain region 2 is set to about $1\times10^{16}$ cm$^{-3}$ and the thickness thereof is set to about 10 µm while the impurity density of the base region 3 is set to about $1\times10^{18}$ cm$^{-3}$ and the thickness thereof is set to about 1 µm, for example, the top-up voltage Va becomes equal to about 0.4 V by setting the distance w to about 1 µm.

As described above, the operation range for achieving the reverse conduction operation with the majority-carrier current is increased by the top-up voltage Va as compared to the related art. Accordingly, it is possible to increase the current density of the reverse conduction current flowing in the heterojunction semiconductor region 9 and thereby to reduce the area of the heterojunction semiconductor region 9. That is to say, it is possible provide a semiconductor device which functions as the switching element and the passive element, and permits higher integration at the same time.

The base region 3 and the heterojunction semiconductor region 9 are arranged appropriately so that a freewheel current can flow at least from the heterojunction semiconductor region 9 to the drain region 2 in the vicinity of the remotest position of the base region 3 from the heterojunction semiconductor region 9 when the freewheel current flows from the source electrode 7 to the drain electrode 8 through the heterojunction semiconductor region 9. Accordingly, the operation range for achieving the reverse conduction operation with the majority-carrier current is increased. In this way, it is possible to increase the current density of the reverse conduction current flowing in the heterojunction semiconductor region 9 and thereby to improve the degree of integration.

When the distance between the heterojunction semiconductor region 9 and the drain electrode 8 is set smaller than the distance between the base region 3 and the drain electrode 8, the operation range for achieving the reverse conduction current with the majority-carrier is further increased. In this way, it is possible to increase the current density of the reverse conduction current flowing in the heterojunction semiconductor region 9 further and thereby to improve the degree of integration further.

Figure 10:
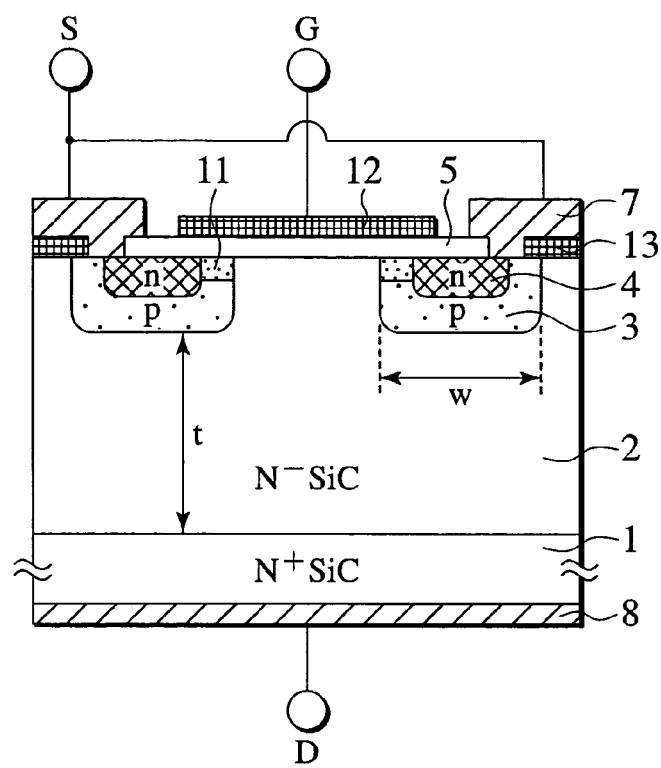
FIG. 10 is a cross-sectional view showing a first modified example of the semiconductor device shown in FIG. 1.

Although FIG. 1 shows the MOSFET including the inversion-type channel, the MOSFET may include an accumulation-type channel provided as an N-type region formed in a given region within the base region 3. That is to say, as shown in FIG. 10, for example, it is also possible to arrange an accumulative position 11 between the base region 3 and the insulating film 5. When the semiconductor device includes the accumulative region (the accumulation-type channel) 11 as shown in FIG. 10, it is possible to conduct the semiconductor device at lower on resistance as compared to the semiconductor device including the inversion-type channel as shown in FIG. 1. Alternatively, a gate electrode 12 and a heterojunction semiconductor region 13 in FIG. 10 are made of P-type polycrystalline silicon. In this way, it is also possible to secure a shielding property. That is to say, when a semiconductor substrate constituting the drain region 2 is of the N-type, it is also possible to reduce the on-resistance by forming the gate electrode 12 and the heterojunction semiconductor region 13 as the P-type.

Figure 11:
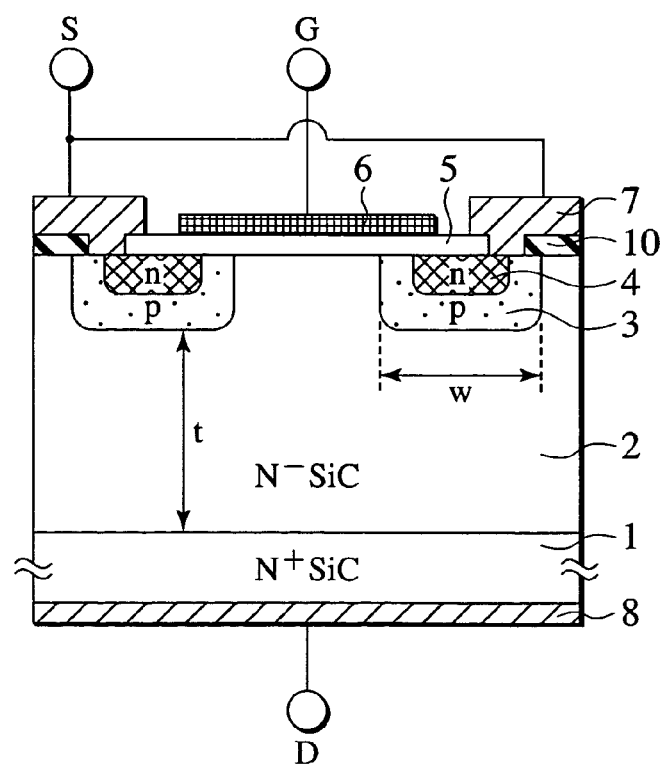
FIG. 11 is a cross-sectional view showing a second modified example of the semiconductor device shown in FIG. 1.

The first embodiment has described the case of using the heterojunction semiconductor region 9 as the majority-carrier passive element. However, the present invention is not limited only to this configuration. For example, as shown in FIG. 11, it is also possible to arrange a Schottky junction region 10 made of a given metal material for forming a Schottky junction with the drain region 2 instead of the heterojunction semiconductor region 9. In this case as well, it is possible to obtain the above-described effect of the top-up voltage Va. That is to say, it is possible to increase the operation range for achieving the reverse conduction operation with the majority-carrier current even when the Schottky junction is used therein. Accordingly, it is possible to improve the degree of integration.

Figure 12:
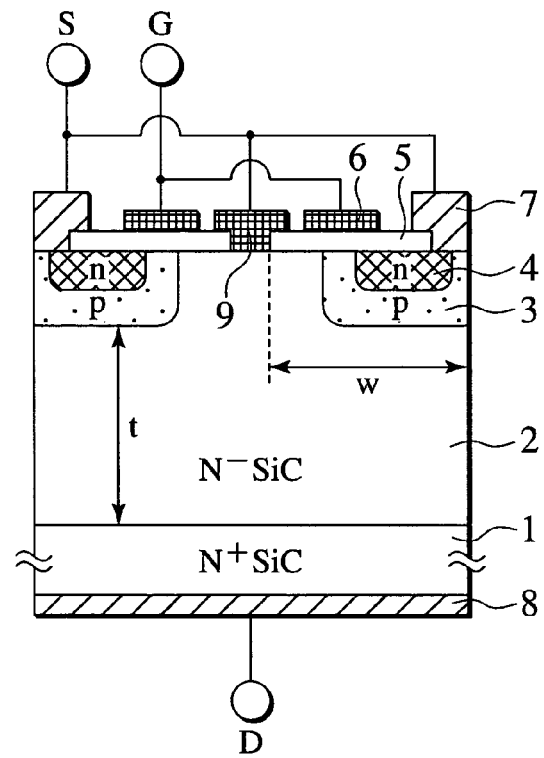
FIG. 12 is a cross-sectional view showing a third modified example of the semiconductor device shown in FIG. 1.

The location for arranging the heterojunction semiconductor region 9 is not limited to the illustration in FIG. 1, and the location can be set freely. For example, as shown in FIG. 12, it is possible to arrange the heterojunction semiconductor region 9 so as to be interposed between the mutually adjacent gate electrodes 6. In this case, the heterojunction semiconductor region 9 is arranged to abut on the drain region 2 while being interposed between the mutually adjacent base regions 3. Moreover, as shown in FIG. 12, a horizontal distance between the heterojunction semiconductor region 9 and the remotest position of the base region 3 from the heterojunction semiconductor region 9 is equivalent to a horizontal difference w from an end of the heterojunction semiconductor region 9 to the right end of the base region 3. Here, in the case of the base region 3 on the left side, the horizontal distance is equivalent to the end of the heterojunction semiconductor region 3 to the left end of the base region 3.

Figure 13:
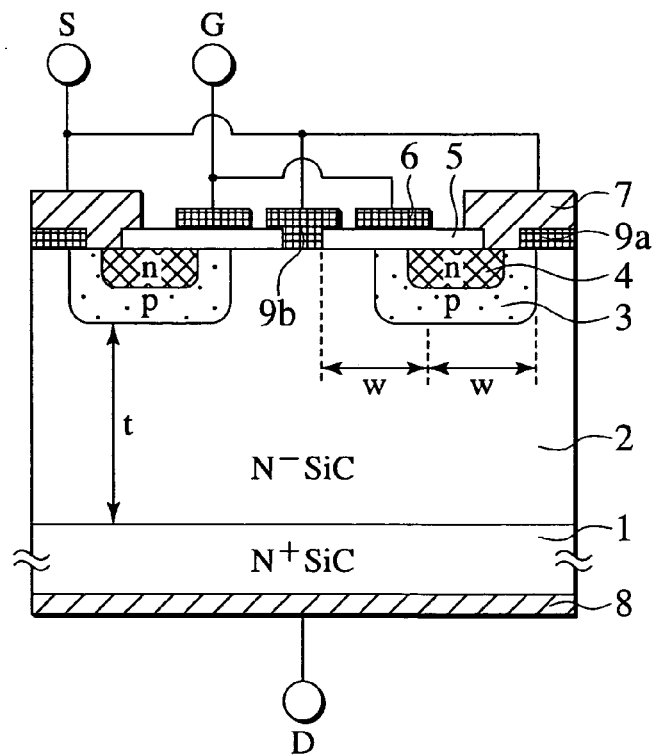
FIG. 13 is a cross-sectional view showing a fourth modified example of the semiconductor device shown in FIG. 1.

Furthermore, as shown in FIG. 13, it is also possible to provide heterojunction semiconductor regions 9a and 9b corresponding to the heterojunction semiconductor regions in the examples shown in FIG. 1 and in FIG. 12 at the same time. That is to say, it is possible to arrange the heterojunction semiconductor region 9b to be interposed between the mutually adjacent base regions 3, and to arrange the heterojunction semiconductor region 9a disposed outside the base region 3 at the same time. In this case, the base region 3 is sandwiched by both of the heterojunction semiconductor regions 9a and 9b. As shown in FIG. 13, a horizontal distance between the heterojunction semiconductor region 9a or 9b and the remotest position of the base region 3 from the heterojunction semiconductor region 9a or 9b is equal to a half of a horizontal distance between both of the heterojunction semiconductor regions 9a and 9b. To be more precise, each of the horizontal distances is equal to a half of a distance between the left end of a portion where the heterojunction semiconductor region 9a on the outside abuts on the drain region 2 and the right end of a portion where the heterojunction semiconductor region 9b sandwiched by the two base regions 3 abuts on the drain region 2. In other words, each of the horizontal difference is equal to a half of the shortest horizontal difference between the portions where the two heterojunction semiconductor region 9a and 9b respectively abut on the drain region 2. As a result, it is possible to reduce the distance w to half. In this way, it is possible to obtain the even higher tp-up voltage Va and thereby to achieve even the higher degree of integration.

Next, when the positive potential is applied to the drain electrode 8 for transition from the reverse conduction from the reverse conduction state to the cut-off state, the energy barrier against the conduction electrons is formed between the drain region 2 and the heterojunction semiconductor region 9 again, whereby the conduction electrons previously flowing between the drain region 2 and the heterojunction semiconductor region 9 are shielded by the energy barrier. Meanwhile, in the reverse conduction mode, the hole current hardly flows in the drain region 2. Accordingly, a reverse recovery current from the reverse conduction state to the cut-off state hardly flows, and a low-loss and high-speed reverse recovery switching operation is realized.

Second Embodiment

Figure 14:
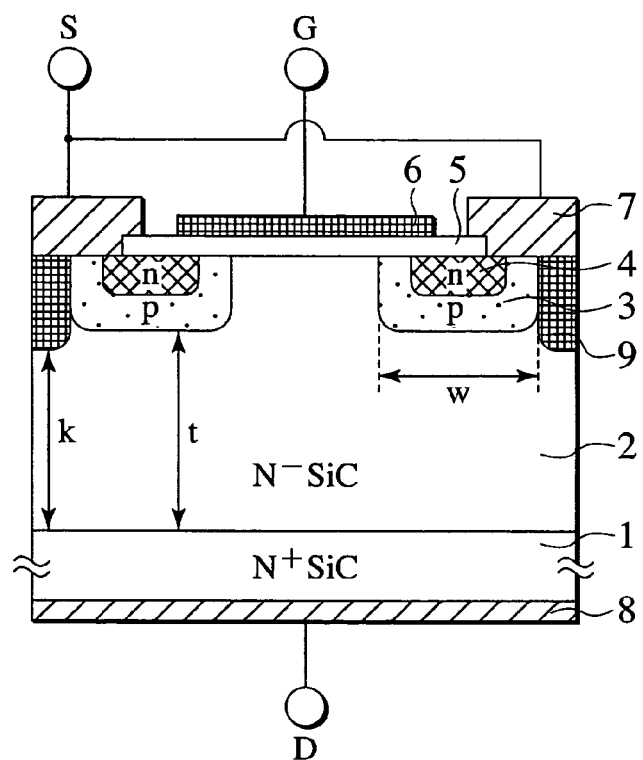
FIG. 14 is a cross-sectional view showing a semiconductor device according to a second embodiment of the present invention.

FIG. 14 is a cross-sectional view corresponding to FIG. 1, which shows a semiconductor device according to a second embodiment of the present invention. In the second embodiment, description of the constituents performing the same operations as those in the semiconductor device shown in FIG. 1 will be omitted. Instead, differences from the semiconductor device shown in FIG. 1 will be described in detail.

As shown in FIG. 14, the heterojunction semiconductor region 9 is formed deeper than the base region 3. That is to say, a thickness k of the drain region 2 immediately below the heterojunction semiconductor region 9 is smaller than the thickness t of the drain region 2 immediately below the base region 3.

Figure 9:
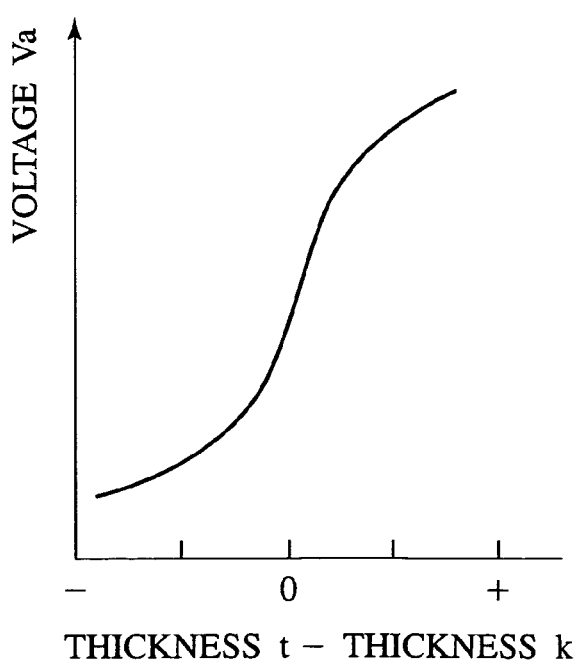
FIG. 9 is a graph showing a relation between an index (thickness t-thickness k) and the voltage Va overriding the diffusion potential.

By forming the deeper heterojunction semiconductor region 9, it is possible to obtain the higher top-up voltage Va as compared to the semiconductor device shown in FIG. 1. FIG. 9 is an example of a calculation result showing a relation between a difference between the thickness t and the thickness k, and, the voltage Va. The voltage Va becomes larger as the difference in thickness (t–k) becomes larger. Meanwhile, in a structure where the difference in thickness (t–k) is zero, that is, in a structure where the bottom of the base region 3 and the bottom of the heterojunction semiconductor region 9 are located on the same plane, the voltage Va reaches an inflection point.

For example, in the semiconductor device shown in FIG. 14, the impurity density of the drain region 2 is set to about $1\times10^{16}$ cm$^{-3}$ and the thickness thereof is set to about 10 μm while the impurity density of the base region 3 is set to about $1\times10^{18}$ cm$^{-3}$ and the thickness thereof is set to about 1 μm. Further, the depth of the heterojunction semiconductor region 9 is set deeper by about 1 μm than the depth of the base region 3. In addition, the horizontal distance w between the heterojunction semiconductor region 9 and the remotest position of the base region 3 from the heterojunction semiconductor position 9 is set to about 1 μm, for example. In this case, it is possible to obtain the top-up voltage Va of about 1.8 V. Accordingly, it is possible to obtain the effect several times higher than the semiconductor device of FIG. 1 in which the heterojunction semiconductor region 9 is formed only on the surface layer portion of the drain region 2.

As described above, by forming the heterojunction semiconductor region 9 deeper than the base region 3, the range for causing the heterojunction semiconductor region 9 to function as the majority-carrier passive element is increased more than the semiconductor device of FIG. 1. In this way, it is possible to increase the current density of the reverse conduction current flowing in the heterojunction semiconductor region 9 further, and to reduce the area of the heterojunction semiconductor region 9 further.

The second embodiment has described the case of using the heterojunction semiconductor region 9 as the majority-carrier passive element. However, the present invention is not limited only to this configuration. For example, as shown in FIG. 11 similarly to the first embodiment, it is also possible to arrange the Schottky junction region 10 made of a given metal material for forming the Schottky junction at the portion of the heterojunction semiconductor region 9. In this case as well, it is possible to obtain the above-described effect of the top-up voltage Va.

Figure 15:
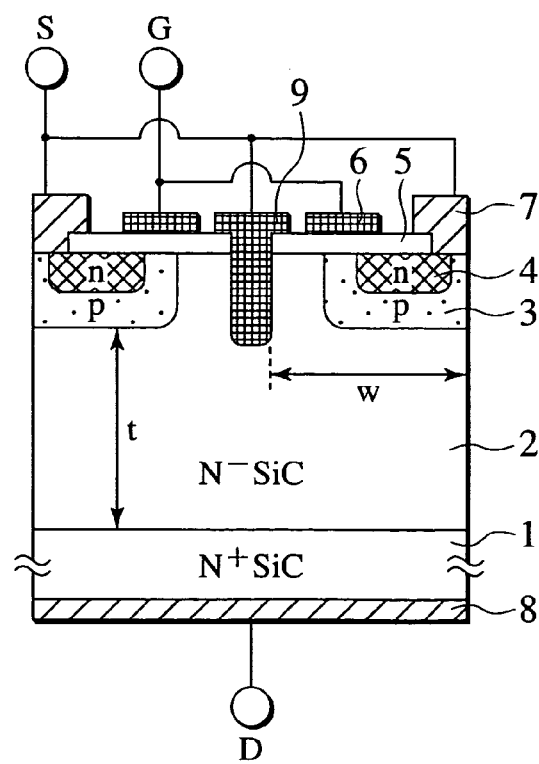
FIG. 15 is a cross-sectional view showing a first modified example of the semiconductor device shown in FIG. 14.

The location for arranging the heterojunction semiconductor region 9 is not limited to the illustration in FIG. 14, and the location can be set freely. For example, as shown in FIG. 15, it is possible to arrange the heterojunction semiconductor region 9 so as to be interposed between the mutually adjacent gate electrodes 6. Moreover, as shown in FIG. 15, the horizontal distance between the heterojunction semiconductor region 9 and the remotest position of the base region 3 from the heterojunction semiconductor region 9 is equivalent to the horizontal difference w from the end of the heterojunction semiconductor region 9 to the right end of the base region 3. Here, in the case of the base region 3 on the left side, the horizontal distance is equivalent to the end of the heterojunction semiconductor region 3 to the heft end of the base region 3.

Figure 16:
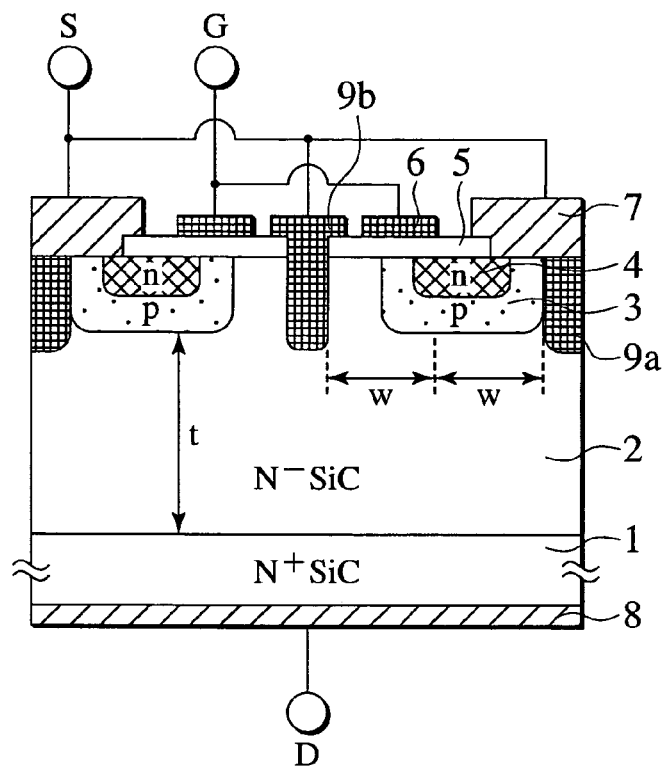
FIG. 16 is a cross-sectional view showing a second modified example of the semiconductor device shown in FIG. 14.

Furthermore, as shown in FIG. 16, it is also possible to provide the heterojunction semiconductor regions 9a and 9b corresponding to the heterojunction semiconductor regions in the examples shown in FIG. 14 and in FIG. 15 at the same time. That is to say, it is possible to arrange the heterojunction semiconductor region 9b to be interposed between the mutually adjacent base regions 3, and to arrange the heterojunction semiconductor region 9a disposed outside the base region 3 at the same time. In this case, the base region 3 is sandwiched by both of the heterojunction semiconductor regions 9a and 9b. As shown in FIG. 16, the horizontal distance between the heterojunction semiconductor region 9a or 9b and the remotest position of the base region 3 from the heterojunction semiconductor region 9a or 9b is equal to a half of the horizontal distance between both of the heterojunction semiconductor regions 9a and 9b. As a result, it is possible to reduce the distance w to half. In this way, it is possible to obtain the even higher top-up voltage Va and thereby to achieve even the higher degree of integration.

Third Embodiment

Figure 17:
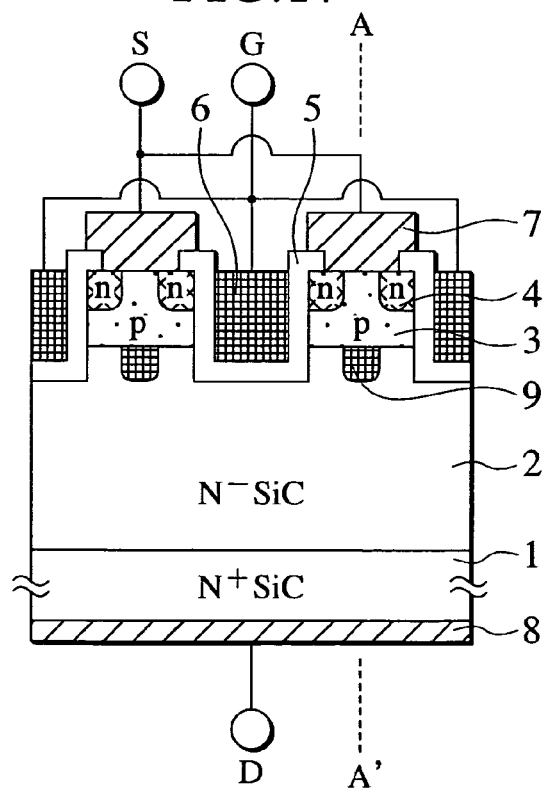
FIG. 17 is a cross-sectional view showing a semiconductor device according to a third embodiment of the present invention.
Figure 18:
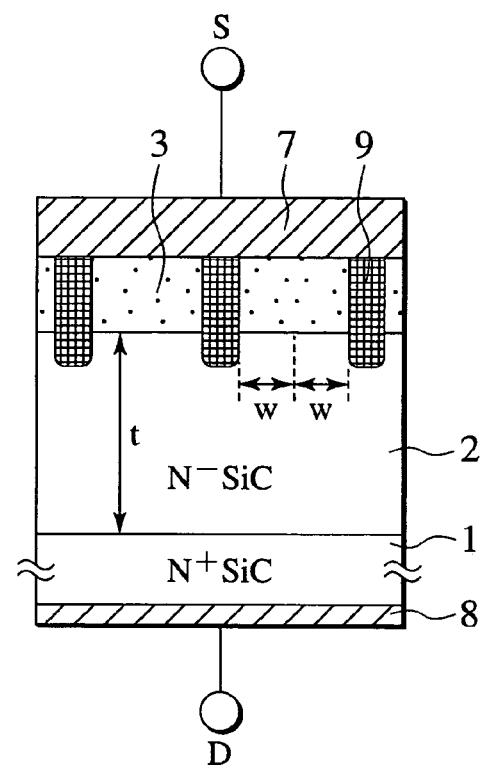
FIG. 18 is a cross-sectional view taken along the A–A' line in FIG. 17.

FIG. 17 is a cross-sectional view showing a semiconductor device according to a third embodiment of the present invention. FIG. 17 is the cross-sectional view corresponding to FIG. 1 showing the first embodiment. Meanwhile, FIG. 18 is a side view taken along the A–A' line in FIG. 17. In the third embodiment, description of the constituents performing the same operations as those in the semiconductor device shown in FIG. 1 will be omitted. Instead, differences from the semiconductor device shown in FIG. 1 will be described in detail.

As shown in FIG. 17 and FIG. 18, the semiconductor device according to the third embodiment has a trench-type MOSFET structure, in which trenches are formed on the surface layer portion of the drain region 2 and the insulating film 5 and the gate electrode 6 are formed inside each of the trenches. Moreover, the heterojunction semiconductor regions 9 are arranged at given intervals along the gate electrodes 6 so as to be interposed between the mutually adjacent gate electrodes 6. According to the semiconductor device shown in FIG. 17 and FIG. 18, it is possible to design the horizontal direction w between the heterojunction semiconductor region 9 and the remotest position of the base region 3 from the heterojunction semiconductor region 9 easily. In this way, it is possible to achieve a structure having the smaller distance w as compared to the semiconductor device shown in FIG. 1.

The heterojunction semiconductor region 9 is formed almost as deep as the depth of the trench where the insulating film 5 and the gate electrode 6 are buried in. However, the present invention is not limited only to this configuration, and the depth of the heterojunction semiconductor region 9 is arbitrary. Nevertheless, by setting the depth of the heterojunction semiconductor region 9 as the same as the depth of the trench where the insulating film 5 and the gate electrode 6 are buried in, it is possible to carry out the step of forming the trench on the substrate and the step of forming the polycrystalline silicon layer as the gate electrode 6 and as the heterojunction semiconductor region 9 at the same time. In this way, the manufacturing process of this semiconductor device is simplified. Moreover, since the heterojunction semiconductor region 9 is formed deeper than the base region 3 as shown in FIG. 14, it is possible to obtain the higher top-up voltage Va.

Figure 19:
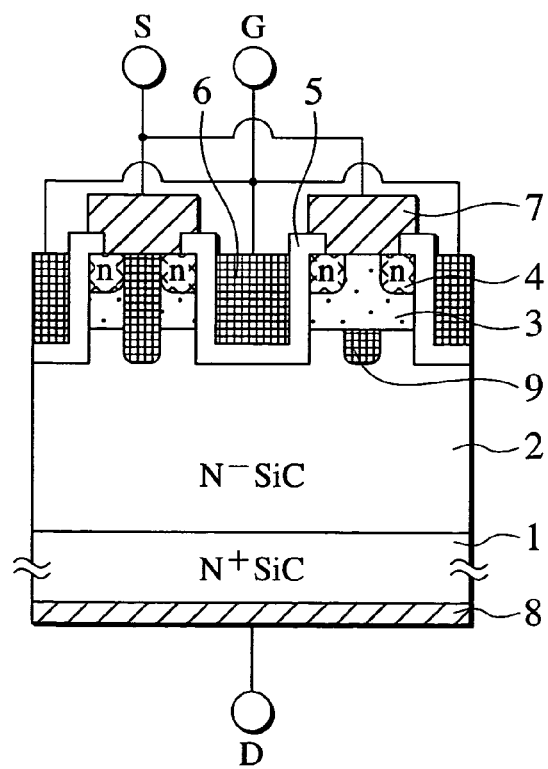
FIG. 19 is a cross-sectional view showing a modified example of the semiconductor device shown in FIG. 17.

In FIG. 17, the heterojunction semiconductor regions 9 of the same shape are repeatedly arranged between the mutually adjacent cells. However, it is also possible to change the shapes of the heterojunction semiconductor regions 9 among the mutually adjacent cells as shown in FIG. 19, for example. In this way, it is possible to arrange the heterojunction semiconductor regions 9 efficiently, and thereby to improve the degree of integration further. In addition, it is also possible to provide a Schottky junction region instead of the heterojunction semiconductor region 9.

Fourth Embodiment

Figure 20:
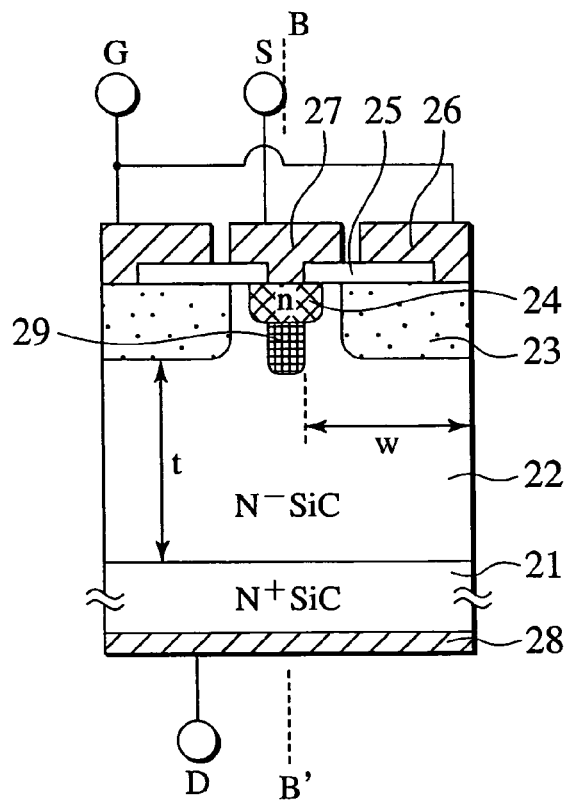
FIG. 20 is a cross-sectional view showing a semiconductor device according to a fourth embodiment of the present invention.
Figure 21:
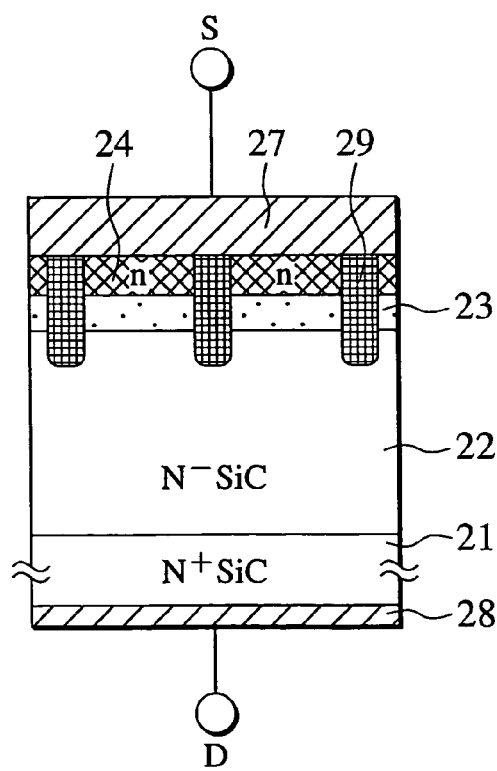
FIG. 21 is a cross-sectional view taken along the B–B' line in FIG. 20.

FIG. 20 and FIG. 21 are cross-sectional views showing a semiconductor device according to a fourth embodiment of the present invention. FIG. 20 is the cross-sectional view corresponding to FIG. 1. Meanwhile, FIG. 21 is a side view taken along the B–B' line in FIG. 20. In the fourth embodiment, description of the constituents performing the same operations as those in the semiconductor device shown in FIG. 1 will be omitted. Instead, differences from the semiconductor device shown in FIG. 1 will be described in detail.

As shown in FIG. 20 and FIG. 21, the semiconductor device according to the fourth embodiment includes a junction field effect transistor (JFET) as the switching element. The semiconductor device uses a semiconductor substrate in which an $N^-$-type drain region 22 is formed on a substrate region 21 made of $N^+$-type silicon carbide of the 4H polytype, for example. A P-type base region 23 is disposed on an upper part of the drain region 22 including a principal surface of the drain region 22, which is opposite with a joint surface between the drain region 22 and the substrate region 21. An $N^+$-type source region 24 is interposed between the mutually adjacent base regions 23. In FIG. 20, the base region 23 and the source region 24 are separated. However, the base region 23 and the source region 24 may contact each other. The base region 23 is connected to a gate electrode 26, the source region 24 is connected to a source electrode 27, and the drain region 22 is connected to a drain electrode 28, respectively. Here, reference numeral 25 denotes an insulating film. Moreover, heterojunction semiconductor regions 29 are arranged at given intervals along the base regions 23 so as to be interposed between the mutually adjacent base regions 23.

As similar to the case of the MOSFET, the heterojunction semiconductor region 9 does not adversely affect an operation of the JFET as the switching element. In the reverse conduction mode, the heterojunction semiconductor region 29 has similar operation and effect as those of the semiconductor device shown in FIG. 1. Since the JFET is used as the switching element, there is a problem in light of improvement in the shielding property between the source region 24 and the drain region 22. However, it is possible to improve the shielding property by locating the heterojunction semiconductor region 9 in a given position.

Although the first to fourth embodiments have been described on the semiconductor devices applying silicon carbide as the substrate material, the present invention is not limited only to this configuration. It is possible to use any type of semiconductor materials as the substrate material, such as silicon, silicon-germanium, gallium nitride or diamond. Although the embodiments have been described on the semiconductor devices applying the silicon carbide of the 4H polytype, it is possible to use silicon carbide of any other type such as the 6H polytype or the 3C polytype.

Each of the embodiments has shown the transistor of a so-called vertical structure configured to flow the drain current in the vertical direction, in which the drain electrode 8 or 28 and the source electrode 7 or 27 are disposed so as to face each other while sandwiching the drain region 2 or 22. However, the present invention is not limited only to this structure. For example, it is also possible to adopt a transistor of a so-called lateral structure configured to flow the drain current in the lateral direction, in which the drain electrode 8 or 28 and the source electrode 7 or 27 are disposed on the same principal surface.

Although the embodiments have been described on the semiconductor devices applying polycrystalline silicon as the material for the heterojunction semiconductor regions 9 and 29, the present invention is not limited only to this configuration. It is possible to use any material as long as such a material can form a heterojunction with silicon carbide.

The embodiments have been described on the case where the heterojunction is formed between the drain region 2 or 22 made of the N-type silicon carbide and the heterojunction semiconductor region 9 or 29 made of the N-type polycrystalline silicon. However, the present invention is not limited only to this configuration. It is also possible to adopt any other combinations such as a combination of N-type silicon carbide and P-type polycrystalline silicon, a combination of P-type silicon carbide and P-type polycrystalline silicon, or P-type silicon carbide and N-type polycrystalline silicon.

The embodiments have been described on the case where the switching element is configured as the MOSFET or the JFET. However, it is also possible to configure other switching elements such as a bipolar transistor.

As described above, according to the first to fourth embodiment of the present invention, it is possible to set the size of the energy barrier against the conduction electrons, which is formed between the drain region and the heterojunction semiconductor region, into a desired size by changing the conductivity type or the impurity density of the heterojunction semiconductor region. This is the characteristic not found in the Schottky junction, in which the size of the energy barrier is inherently determined by the work function of the metal material. For this reason, it is easy to achieve optimal design of the passive element in response to a withstand voltage system of the MOSFET as the switching element. Accordingly, it is possible to suppress the diffusion potential in the reverse conduction mode and to improve the degree of integration per unit area. As a result, it is possible to reduce the size of the elements and to simplify the manufacturing processes thereof.

The entire content of a Patent Application No. TOKUGAN 2003-420383 with a filing date of Dec. 18, 2003 in Japan is hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A semiconductor device comprising:
   a three-terminal switching element comprising:
      a drain region made of a semiconductor substrate of a first conductivity type;
      a base region of a second conductivity type disposed on an upper part of the drain region;
      a source region of the first conductivity type disposed on an upper part of the base region or on the upper part of the drain region;
      a drain electrode connected to the drain region;
      a source electrode connected to the source region; and
      a gate electrode configured to control at least a current flowing between the drain electrode and the source electrode; and
   a heterojunction semiconductor region configured to form a heterojunction with the drain region, the heterojunction semiconductor region being connected to the source electrode and having a band gap different from a band gap of the drain region.

2. The semiconductor device of claim 1, wherein the base region and the heterojunction semiconductor region are arranged so as to allow a freewheel current to flow at least from the heterojunction semiconductor region to the drain region in the vicinity of the remotest position of the base region from the heterojunction semiconductor region when the freewheel current flows from the source electrode to the drain electrode through the heterojunction semiconductor region.

3. The semiconductor device of claim 1, wherein a distance between the heterojunction semiconductor region and the drain electrode is shorter than a distance between the base region and the drain electrode.

4. The semiconductor device of claim 1,
   wherein the source electrode and the drain electrode are disposed so as to face each other while sandwiching the drain region, and
   a distance between the heterojunction semiconductor region and the remotest position of the base region from the heterojunction semiconductor region in a direction parallel to a principal surface of the semiconductor substrate is equal to or less than a thickness of the drain region immediately below the base region.

5. The semiconductor device of claim 1, wherein the heterojunction semiconductor region is disposed deeper than the base region from a principal surface of the semiconductor substrate.

6. The semiconductor device of claim 1,
   wherein the gate electrode is at least disposed above the drain region and the source region through an insulating film, and
   the three-terminal switching element is a metal oxide semiconductor field effect transistor.

7. The semiconductor device of claim 1, wherein the gate electrode is made of the same material as the heterojunction semiconductor region.

8. The semiconductor device of claim 6, wherein the gate electrode and the heterojunction semiconductor region are made of a semiconductor material of the second conductivity type.

9. The semiconductor device of claim 1, wherein the heterojunction semiconductor region is disposed between the mutually adjacent base regions.

10. The semiconductor device of claim 1, wherein the heterojunction semiconductor region comprises:
    a first heterojunction semiconductor region disposed on outside of the mutually adjacent base regions; and
    a second heterojunction semiconductor region disposed between the mutually adjacent base regions.

11. The semiconductor device of claim 10, wherein a distance between the heterojunction semiconductor region and the remotest position of the base region from the heterojunction semiconductor region in a direction parallel to a principal surface of the semiconductor substrate is equal to one-half of the shortest distance between the first heterojunction semiconductor region and the second heterojunction semiconductor region in the direction parallel to the principal surface of the semiconductor substrate.

12. The semiconductor device of claim 6, wherein the gate electrode is buried inside a trench formed in the drain region through the insulating film.

13. The semiconductor device of claim 1, wherein the three-terminal switching element is a junction field effect transistor.

14. The semiconductor device of claim 1, wherein the semiconductor substrate is made of wide-gap semiconductor.

15. The semiconductor device of claim 1, wherein the semiconductor substrate is made of silicon carbide.

16. The semiconductor device of claim 1, wherein the heterojunction semiconductor region is made of any of single-crystal silicon, polycrystalline silicon, and amorphous silicon.

17. A semiconductor device comprising:
    a three-terminal switching element comprising:
       a drain region made of a semiconductor substrate of a first conductivity type;
       a base region of a second conductivity type disposed on an upper part of the drain region;
       a source region of the first conductivity type disposed on an upper part of the base region or on the upper part of the drain region;
       a drain electrode connected to the drain region;
       a source electrode connected to the source region; and
       a gate electrode configured to control at least a current flowing between the drain electrode and the source electrode; and a Schottky junction region configured to form a Schottky junction with the drain region, the Schottky junction region being connected to the source electrode, wherein the base region and the Schottky junction region are arranged so as to allow a freewheel current to flow at least from the Schottky junction region to the drain region in the vicinity of the remotest position of the base region from the Schottky junction region when the freewheel current flows from the source electrode to the drain electrode through the Schottky junction region.

18. The semiconductor device of claim 17, wherein a distance between the Schottky junction region and the drain electrode is shorter than a distance between the base region and the drain electrode.

19. The semiconductor device of claim 17,
wherein the source electrode and the drain electrode are disposed so as to face each other while sandwiching the drain region, and
a distance between the Schottky junction region and the remotest position of the base region from the Schottky junction region in a direction parallel to a principal surface of the semiconductor substrate is equal to or less than a thickness of the drain region immediately below the base region.

20. The semiconductor device of claim 17, wherein the Schottky junction region is disposed deeper than the base region from a principal surface of the semiconductor substrate.

21. The semiconductor device of claim 17,
wherein the gate electrode is at least disposed above the drain region and the source region through an insulating film, and
the three-terminal switching element is a metal oxide semiconductor field effect transistor.

22. The semiconductor device of claim 17, wherein the Schottky junction region is disposed between the mutually adjacent base regions.

23. The semiconductor device of claim 17, wherein the Schottky junction region comprises:
a first Schottky junction region disposed on outside of the mutually adjacent base regions; and
a second Schottky junction region disposed between the mutually adjacent base regions.

24. The semiconductor device of claim 23, wherein a distance between the Schottky junction region and the remotest position of the base region from the Schottky junction region in a direction parallel to a principal surface of the semiconductor substrate is equal to one-half of the shortest distance between the first Schottky junction region and the second Schottky junction region in the direction parallel to the principal surface of the semiconductor substrate.

* * * * *